(12) United States Patent
Tang

(10) Patent No.: US 12,177,553 B2
(45) Date of Patent: Dec. 24, 2024

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Junpu Tang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/286,458

(22) PCT Filed: Feb. 25, 2021

(86) PCT No.: PCT/CN2021/077826
§ 371 (c)(1),
(2) Date: Apr. 17, 2021

(87) PCT Pub. No.: WO2022/156034
PCT Pub. Date: Jul. 28, 2022

(65) Prior Publication Data
US 2024/0129611 A1  Apr. 18, 2024

(30) Foreign Application Priority Data
Jan. 25, 2021 (CN) .......................... 202110098877.9

(51) Int. Cl.
H04N 23/57 (2023.01)
H04N 23/51 (2023.01)
H10K 59/80 (2023.01)

(52) U.S. Cl.
CPC ............. *H04N 23/57* (2023.01); *H04N 23/51* (2023.01); *H10K 59/8794* (2023.02)

(58) Field of Classification Search
CPC ..... H04N 23/57; H04N 23/51; H10K 59/8794
See application file for complete search history.

(56) References Cited

U.S. PATENT DOCUMENTS 10,845,664 B2 * 11/2020 Yu ........................... H04N 23/51
2021/0050389 A1 * 2/2021 Yang .................... H01L 27/1214
(Continued)

FOREIGN PATENT DOCUMENTS

CN  208224635 U  12/2018
CN  109716174 A   5/2019
(Continued)

OTHER PUBLICATIONS

International Search Report in International application No. PCT/CN2021/077826, mailed on Aug. 4, 2021.
(Continued)

*Primary Examiner* — Amy R Hsu
(74) *Attorney, Agent, or Firm* — PV IP PC; Wei Te Chung

(57) ABSTRACT

The present disclosure provides a display device, including a display panel and a camera, the camera is attached to a side of the display panel by an optical glue, wherein the camera includes a housing, a lens, and a spacer. The spacer is fixed on a side of the housing facing the display panel and completely covers a light incident surface of the lens, wherein a first surface of the spacer is attached to the side of the display panel by the optical glue, and the first surface of the spacer is a flat surface, which prevents a problem of reduced optical effect of the camera.

20 Claims, 4 Drawing Sheets

(56) References Cited

U.S. PATENT DOCUMENTS

| | | | | |
|---|---|---|---|---|
| 2021/0134889 A1* | 5/2021 | Zhang | ............... | H10K 59/65 |
| 2021/0151425 A1* | 5/2021 | Kim | ............... | H04N 23/55 |
| 2021/0202568 A1* | 7/2021 | Kim | ............... | H10K 59/65 |
| 2022/0116518 A1* | 4/2022 | Chen | ............... | H04M 1/0264 |

FOREIGN PATENT DOCUMENTS

| | | |
|---|---|---|
| CN | 209590474 U | 11/2019 |
| CN | 111179744 A | 5/2020 |
| CN | 210605742 U | 5/2020 |
| CN | 111403433 A | 7/2020 |
| CN | 111562698 A | 8/2020 |
| CN | 111624812 A | 9/2020 |
| CN | 111757220 A | 10/2020 |
| CN | 111866220 A | 10/2020 |
| WO | 2019237270 A1 | 12/2019 |

OTHER PUBLICATIONS

Written Opinion of the International Search Authority in International application No. PCT/CN2021/077826, mailed on Aug. 4, 2021.

Chinese Office Action issued in corresponding Chinese Patent Application No. 202110098877.9 dated May 30, 2024, pp. 1-6.

\* cited by examiner

DISPLAY DEVICE

RELATED APPLICATIONS

This application is a Notional Phase of PCT Patent Application No. PCT/CN2021/077826 having international filing date of Feb. 25, 2021, which claims the benefit of priority of Chinese Patent Application Nos. 202110098877.9 filed on Jan. 25, 2021. The contents of the above applications are all incorporated by reference as if fully set forth herein in their entirety.

FIELD OF INVENTION

The present disclosure relates to the field of display technology, and more particularly to a display device.

BACKGROUND OF INVENTION

With development of industry of portable electronic devices, such as mobile phones, tablet computers, e-books, and navigation devices, a camera under panel (CUP) technology can provide better visual enjoyment and interference-free all-round display, therefore gradually become a development trend.

A display panel of current CUP display devices is a small transparent screen in a display region of a corresponding camera (referred to as a camera area). When not taking pictures, the camera area can display screen content normally, and when taking pictures, the camera area becomes a transparent film.

In this kind of CUP display device, the camera is bonded to the display panel by an optical glue. During a bonding process, the optical glue fills a gap between camera lens and housing to flatten a side of the lens facing the display panel, to make it easy to fit. However, a light incident surface of the current camera lens is an arc or an uneven curved surface structure. Due to characteristics of the current optical glue, the optical glue cannot be completely filled into a tiny gap formed by the lens and the housing. As a result, the optical glue forms a non-planar structure in a region on the light incident surface of the lens, and voids or bubbles are formed between the optical glue and the light incident surface of the lens, which affects imaging quality of the lens and shooting effect of the camera under screen.

SUMMARY OF INVENTION

The embodiments of the present disclosure provide a display device, which can solve a problem of a decrease in an optical effect of the camera under screen and the display panel in the prior art, and improve the imaging quality of the lens and the shooting effect of the camera under screen.

To solve the above problems, the technical solutions provided by the present disclosure are as follows:

This embodiment provides a display device, including:
The camera is attached to one side of the display panel by optical glue, and the camera includes:
 a camera attached to a side of the display panel by an optical glue, wherein the camera includes:
 a housing; and
 a lens fixed and accommodated in the housing; and
 a spacer fixed on a side of the housing facing the display panel and completely covering a light incident surface of the lens, wherein a first surface of the spacer is attached to the side of the display panel by the optical glue, and the first surface of the spacer is a flat surface.

Optionally, the side of the housing facing the display panel is provided with at least one fixing groove, a first adhesive is provided in the at least one fixing groove, and the spacer is fixedly connected to the housing by the first adhesive.

Optionally, the spacer is provided with a plurality of engaging members, the housing is correspondingly provided with a plurality of engaging grooves adapted to the plurality of engaging members, and the spacer and the housing are fixedly connected to each other by the plurality of engaging members and the plurality of engaging grooves.

Optionally, a positioning member is provided on a surface of the housing facing the display panel.

Optionally, a height of the positioning member protruding from the surface of the housing facing the display panel is equal to a thickness of the spacer.

Optionally, the positioning member is arranged around the spacer.

Optionally, an area the optical glue is applied to is equal to an area of the spacer.

Optionally, the optical glue is defined with a first region located at a center position and a second region located at a periphery of the first region, and an area of the first region is equal to an area of the spacer.

Optionally, the optical glue in the first region is directly bonded to the spacer, and the optical glue in the second region is directly bonded to the positioning member.

Optionally, the positioning member abuts against a side of an outer edge of the spacer.

Optionally, a gap between the positioning member and the spacer is provided with a first adhesive.

Optionally, the spacer is parallel to the display panel.

Optionally, the spacer further comprises a second surface disposed opposite to the first surface, and the second surface is parallel to the first surface.

Optionally, the spacer and the lens are spaced apart.

Optionally, the display panel further comprises a first display region, a second display region, and a functional film layer disposed on the side of the display panel facing the camera, the functional film layer is provided with a groove at a position corresponding to the second display region, and the spacer is disposed in the groove.

Optionally, the functional film layer comprises a backplate and a heat dissipation layer, the backplate is disposed between the display panel and the heat dissipation layer, the groove comprises a first opening formed on the backplate at a position corresponding to the second display region and a second opening formed on the heat dissipation layer at a position corresponding to the second display region, and an area of the first opening is smaller than or equal to an area of the second opening.

Optionally, part of the housing is accommodated in the second opening.

Optionally, a second adhesive is provided on a periphery of the housing, and the housing is fixedly connected to the heat dissipation layer by the second adhesive.

Optionally, the second display region is a light-transmitting display region possessing a display function and a light-transmitting function.

Optionally, a type of the display panel is an organic electroluminescence display panel or a light-emitting diode display panel.

In the display device provided by the present disclosure, a spacer covering the light incident area of the lens of the camera is arranged between the optical glue and the camera, and at the same time, a side surface of the spacer facing the optical glue is set as a flat surface to relieve the problem that the optical glue on the display panel directly covers the lens during the process of attaching the display panel to the camera, resulting in a decrease in the optical effect of the camera.

DESCRIPTION OF FIGURES

In order to explain the technical solutions in the embodiments of the present disclosure more clearly, the following will briefly introduce the figures needed in the description of the embodiments. Obviously, the figures in the following description are only some embodiments of the present disclosure. For those skilled in the art, other figures can be obtained based on these figures without inventive steps.

DETAILED DESCRIPTION OF PREFERRED EMBODIMENTS

Figure 1:
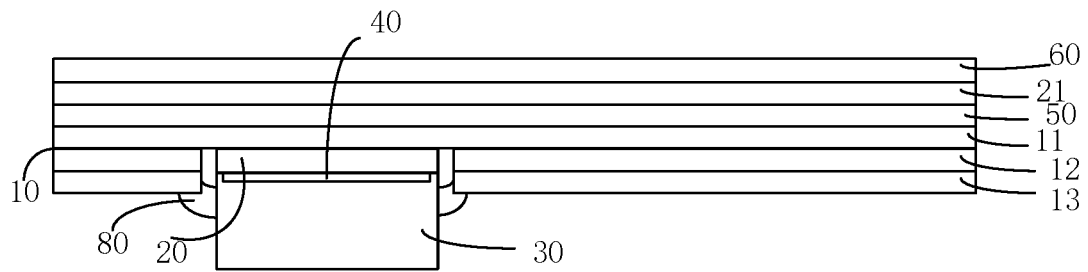
FIG. 1 is a schematic structural diagram of a display device provided in Embodiment 1 of the present disclosure.

The technical solutions in the embodiments of the present disclosure will be clearly and completely described below in conjunction with the figures in the embodiments of the present disclosure. Obviously, the described embodiments are only a part of the embodiments of the present disclosure, rather than all the embodiments. Based on the embodiments in the present disclosure, all other embodiments obtained by those skilled in the art without inventive steps fall within the protection scope of the present disclosure.

In the description of the present disclosure, it should be understood that the terms "center", "longitudinal", "transverse", "length", "width", "thickness", "upper", "lower", "front", "back", "left", "right", "vertical", "horizontal", "top", "bottom", "inner", "outer", "clockwise", "counterclockwise" and other directions or positional relationship is based on the orientation or positional relationship shown in the figures, and is only for the convenience of describing the present disclosure and simplifying the description, and does not indicate or imply that the device or element referred to must have a specific orientation, be constructed and operated in a specific orientation. Therefore, it cannot be understood as a restriction on the present disclosure. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present disclosure, "a plurality of" means two or more than two, unless otherwise specifically defined.

In the description of the present disclosure, it should be noted that, unless otherwise clearly specified and limited, the terms "installation", "connection" and "connection" should be understood in a broad sense. For example, it can be a fixed connection, a detachable connection, or an integral connection; it can be a mechanical connection, it can be an electrical connection, or can communicate with each other; it can be directly connected, or indirectly connected through an intermediate medium, and it can be two interconnections between two elements or the interaction between two elements. For those of ordinary skill in the art, the specific meaning of the above terms in the present disclosure can be understood according to the specific situation.

In the present disclosure, unless expressly stipulated and defined otherwise, the "above" or "below" of the first feature of the second feature may include the first and second features in direct contact, or may include the first and second features not in direct contact but through other features between them. Moreover, "above", "upon", and "on" the second feature of the first feature includes the first feature being directly above and obliquely above the second feature, or merely indicating that the first feature is higher in level than the second feature. The "below", "beneath" and "under" of the second feature of the first feature includes the first feature directly below and obliquely below the second feature, or it simply means that the level of the first feature is smaller than the second feature. The description of the "size" of the component region in the text specifies the "area" of the component region.

The following disclosure provides many different embodiments or examples for realizing different structures of the present disclosure. In order to simplify the disclosure of the present disclosure, the components and settings of specific examples are described below. Of course, they are only examples and are not intended to limit the present disclosure. In addition, the present disclosure may repeat reference numerals and/or reference letters in different examples. Such repetition is for the purpose of simplification and clarity, and does not indicate the relationship between the various embodiments and/or settings discussed. In addition, the present disclosure provides examples of various specific processes and materials, but those of ordinary skill in the art may be aware of the application of other processes and/or the use of other materials. The embodiment of the present disclosure provides a display device. Detailed descriptions are provided below. It should be noted that the description order of the following embodiments is not intended to limit the preferred order of the embodiments.

An embodiment of the present disclosure discloses a display device, including: a display panel; and a camera attached to a side of the display panel by an optical glue, wherein the camera includes: a housing; a lens fixed and accommodated in the housing; and the spacer is fixed on a side of the housing facing the display panel and completely covering a light incident surface of the lens, wherein a first surface of the spacer is attached to the side of the display panel by the optical glue, and the first surface of the spacer is a flat surface. In the display device provided by the present disclosure, a spacer covering the light incident area of the lens of the camera is arranged between the optical glue and the camera, which prevents the problem that the optical glue on the display panel directly covers the lens during the process of attaching the display panel to the camera, resulting in a decrease in the optical effect of the camera.

Embodiment 1

Figure 2:
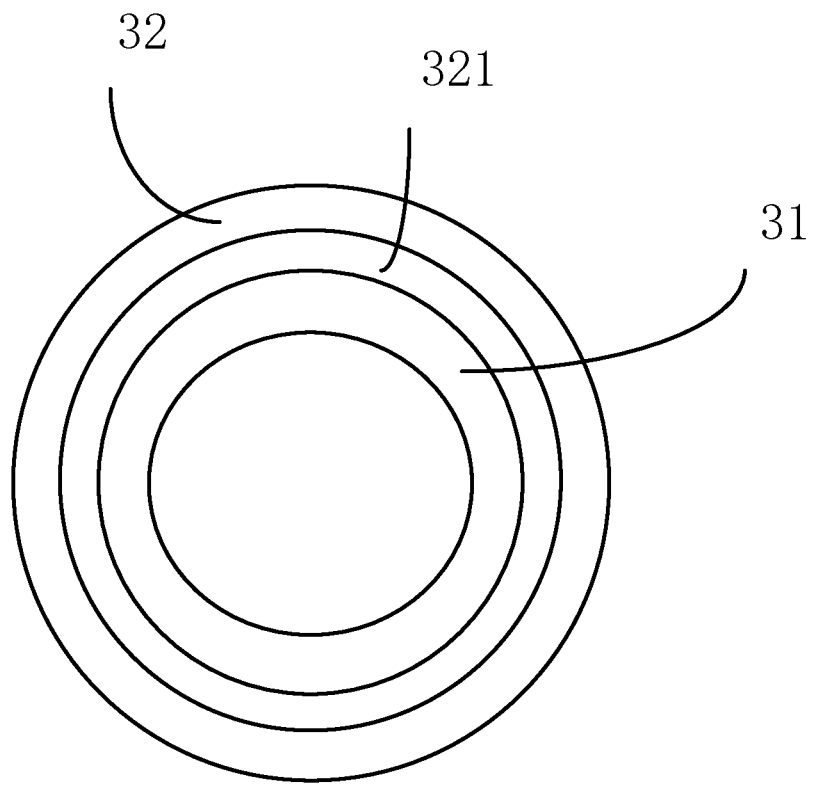
FIG. 2 is a schematic top view of a camera module provided in Embodiment 1 of the present disclosure.
Figure 3:
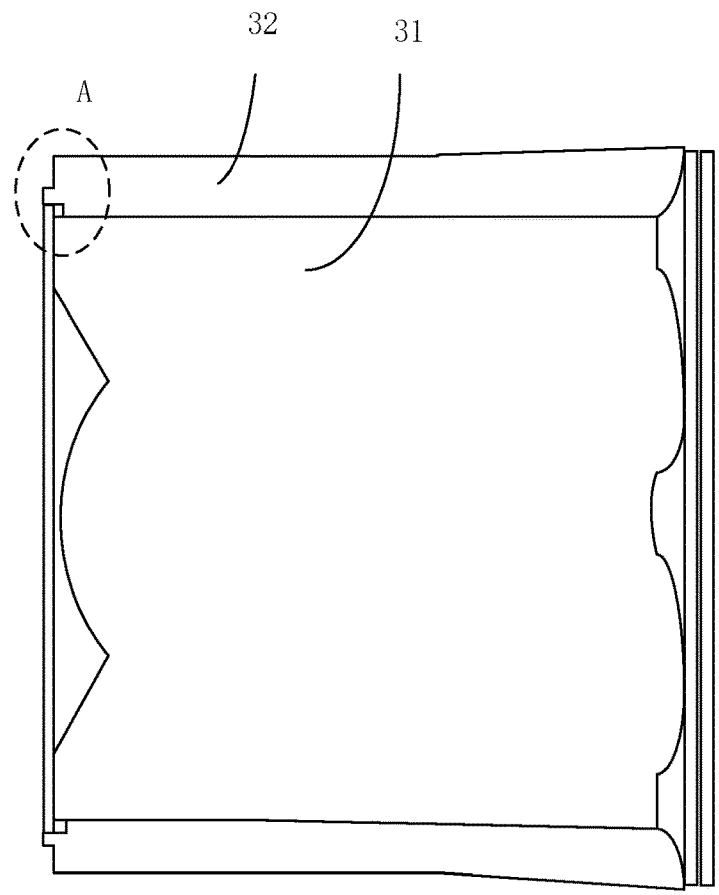
FIG. 3 is a schematic structural diagram of the camera module provided in Embodiment 1 of the present disclosure.
Figure 4:
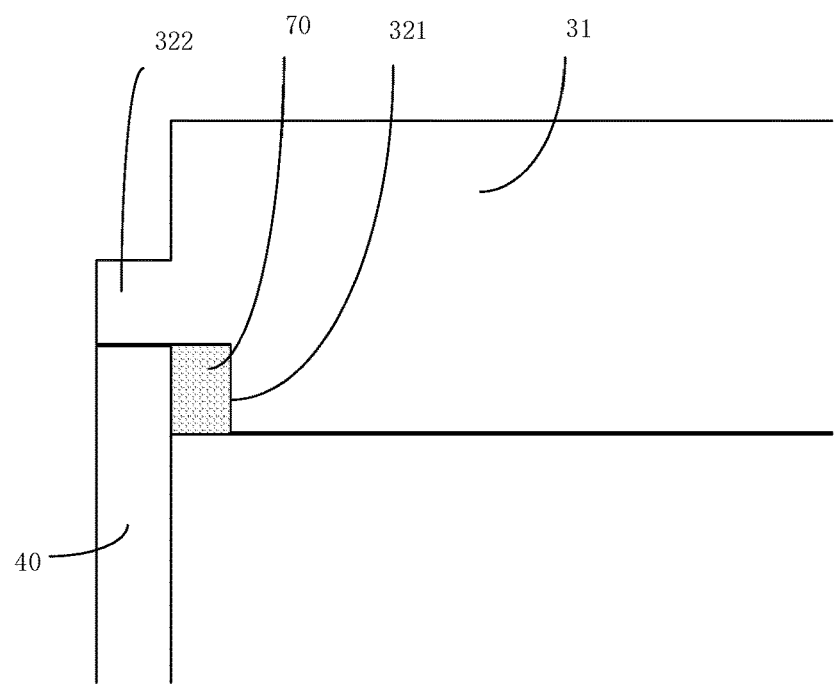
FIG. 4 is an enlarged schematic diagram of A in FIG. 3.

FIG. 1 is a schematic structural diagram of a display device provided in Embodiment 1 of the present disclosure, FIG. 2 is a schematic top view of a camera provided in Embodiment 1 of the present disclosure, FIG. 3 is a schematic structural diagram of the camera module provided in Embodiment 1 of the present disclosure; FIG. 4 is a diagram enlarged schematic diagram of A in FIG. 3. As shown in FIGS. 1 to 4, the Embodiment 1 of the present disclosure discloses a display device 10, including: a display panel 11, a camera 30 attached to a side of the display panel 11 by an optical glue 20, wherein the camera 30 comprises: a housing 32; a lens 31 fixed and accommodated in the housing 32; and a spacer 40 fixed on a side of the housing 32 facing the display panel 11 and completely covering a light incident surface of the lens 31, wherein a first surface of the spacer 40 is attached to the side of the display panel 11 by the optical glue 20, and the first surface of the spacer is a flat surface. In the display device 10 provided in the present disclosure, a spacer 40 covering the light incident area of the lens 31 of the camera 30 is provided between the optical glue 20 and the camera 30, which prevents the problem that the optical glue 20 on the display panel 11 directly covers the lens 31 during the process of attaching the display panel 11 to the camera 30, and causes the optical effect of the camera 30 to decline.

In this embodiment, the type of the display panel is, for example, an OLED display panel. The display panel 11 includes, for example, an array substrate and various film structures disposed on the array substrate. The array substrate may be a flexible substrate or a rigid substrate, and a material of the array substrate includes one or more of glass, plastic, silicon dioxide, polyethylene, polypropylene, polystyrene, polylactic acid, polyethylene terephthalate, polyimide, and polyurethane. Each film layer structure includes, for example, a pixel driving circuit layer, a light-emitting layer, and an encapsulation layer. The pixel driving circuit layer, the light-emitting layer, and the encapsulation layer are, for example, disposed on a side of the array substrate, wherein the side is, for example, a light-emitting side of the display panel.

The display panel 11 includes, for example, a first display region and a second display region. The first display region of the display panel is, for example, a conventional display region, the conventional display region possess, for example, a display function, and the second display region of the display panel is, for example, transparent. The light display region, which possess, for example, a light transmission function and a display function. The camera 30 is provided on a side of the display panel 11, wherein the side is, for example, a backlight side of the display panel 11, and the camera 30 is provided corresponding to the second display region. When the first display region performs the display function, a plurality of pixel units which are located in the first display region are driven by the pixel driving circuit on the array substrate to emit light; when the second display region performs the display function, a plurality of pixel units which are located in the second display region are driven by the pixel driving circuit on the array substrate the pixels to emit light. The camera 30 located on the side of the light-transmitting display region is blocked by the light-transmitting display region and cannot be observed by the user or terminal located on the side of the light-transmitting display region away from the camera 30. Furthermore, when the second display region and the first display region both perform display functions, the camera 30 on the side of the second display region can be hidden, and the display panel can realize the entire screen display, that is, a true full-screen display. When the first display region performs the display function, a plurality of pixel units which are located in the first display region are driven by the pixel driving circuit on the array substrate to emit light, and when the second display region performs a light transmission function, the plurality of pixel units located in the second display region do not emit light, the light-transmitting display region is in a light-transmitting state, and the camera 30 on one side of the light-transmitting display region can receive ambient light from the outside into the second display region, so as to realize normal light-sensing, that is, realize that the display panel possess the light-sensing function while performing the display function.

In this embodiment, the camera 30 includes a housing 32 and at least one lens 31 fixed and accommodated in the housing 32. When a number of the lens 31 is one, the camera 30 is a single camera module, and when the number of the lens 31 is multiple, the camera 30 is a multi-camera module. This embodiment does not limit the specific composition of each lens 31 and the surface state of the light-incident surface. Each lens 31 can be laminated by a plurality of optical lenses. The surface state of the light-incident surface of the lens 31 can be an arc or a curved surface containing multiple concave and convex surfaces. In addition, the surface state of the light-incident surface of the lens 31 can also be flat, because the side of the housing 32 facing the display panel 11 protrudes from the lens 31 when the light-incident surface of the lens 31 is smaller, and due to the characteristics of the optical glue (such as high viscosity), when the display panel 11 is bonded to the camera 30 by the optical glue 20, there may still be cases where the optical glue 20 corresponding to the light incident surface of the lens 31 cannot be filled into the gap space formed by the housing 32 and the lens 31.

In this embodiment, the display device 10 further includes a spacer 40. The spacer 40 is fixed on the side of the housing 32 facing the display panel 11 and completely covers the light incident surface of the lens 31, wherein a first surface of the spacer 40 is attached to the side of the display panel 11 by the optical glue 20 and, the first surface of the spacer is a flat surface. Since the spacer 40 is disposed between the optical glue 20 and the camera 30, and the spacer 40 covers the light incident surface of the lens 31, the first surface where the spacer 40 and the optical glue 20 are attached is a flat surface. Therefore, when the display panel 11 is attached to the camera 30 by the optical glue 20, the spacer 40 can uniformly coat the optical glue 20 above the light incident surface of the lens 31, ensuring that the light entering the lens 31 from the outside will not be affected by the optical glue 20, and the formation of bubbles or gaps between the optical glue 20 and the light incident surface of the lens 31 is prevented, and the imaging quality and shooting effect of the lens 31 and the camera 30 are guaranteed.

In this embodiment, the spacer 40 further includes a second surface disposed opposite to the first surface, and the second surface is parallel to the first surface. That is, the spacer 40 is a plate-like structure with a uniform thickness, thereby ensuring that the light incident to the lens 31 will not be affected by the setting of the spacer 40 and ensuring the optical effect of the camera 30.

In this embodiment, the spacer 40 is, for example, arranged parallel to and opposite to the display panel 11. Since the spacer 40 is parallel to the display panel 11, which enables the optical glue 20 to maintain a uniform thickness and is arranged between the spacer 40 and the display panel 11, ensuring that the light incident on the lens 31 will not be affected by the setting of the optical glue 20, and ensuring the optical effect of camera 30.

In this embodiment, the spacer 40 and the lens 31 are spaced apart. Specifically, an outer edge of the spacer 40 protrudes from the lens 31. At least one fixing groove 321 is provided on the surface of the housing 32 facing the side of the display panel 11, and the first adhesive is arranged in the fixing groove 321. The outer edge of the spacer 40 is fixedly connected to the housing 32 by the first adhesive, so that the spacer 40 can be stably arranged above the lens 31. This embodiment does not limit a number of fixing grooves 321, when there is one fixing groove 321, it is, for example, an annular fixing groove shown in FIG. 2 of the specification of the present disclosure, and when the number of the fixing grooves 321 is multiple, they are, for example, a plurality of groove structures arranged on the surface of the housing 32 facing the display panel 11 at intervals. This embodiment does not limit a location of the fixing groove 321. For example, it can be set on the surface of the housing 32 facing the display panel 11 and the adjacent position of the lens 31 as shown in FIG. 2 of the specification. It can also be arranged on the space between the surface of the housing 32 facing the display panel 11 and the lens 31, as long as the arrangement of the fixing groove 321 and the first adhesive located in the fixing groove 321 does not affect the optical effect of the lens 31. This embodiment does not limit the material of the first adhesive, which is, for example, a glue that is liquid at room temperature.

Further, a surface of the housing 32 facing the display panel 11 is further provided with a positioning member 322 protruding toward the display panel 11, and the positioning member 322 on the housing 32 abuts against a side of an outer edge of the spacer 40, then the spacer 40 can be positioned and fixed. Specifically, the positioning member 322 is fixed on the surface of the housing 32 facing the display panel 11, and is integrally formed with the housing 32. In other embodiments of the present disclosure, the positioning member 322 can also be detachably connected to the housing 32.

In this embodiment, the material of the spacer 40 is, for example, one or more of glass, plastic, silicon dioxide, polyethylene, polypropylene, polystyrene, polylactic acid, polyethylene terephthalate, polyimide, and polyurethane. Preferably, the spacer 40 has a certain rigidity so as to support the optical glue 20 on the first surface of the spacer 40 during the process of attaching the display panel 11 and the camera 30 by the optical glue 20.

In this embodiment, the display device 10 further includes a functional film layer disposed on the display panel 11, and the functional film layer is disposed on the side of the display panel 11 facing the camera 30, that is, the backlight side of the display panel 11. The functional film layer includes a backplate 12 and a heat dissipation layer 13. The backplate 12 is made of, for example, a PET material. The heat dissipation layer 13 is made of, for example, a metal material with high thermal conductivity or an inorganic non-metallic material. Specifically, the backplate 12 is disposed between the array substrate and the heat dissipation layer 13. Both the backplate 12 and the heat dissipation layer 13 are provided with openings, so that the functional film layer is formed with grooves in the area corresponding to the second display region. The optical glue 20, the spacer 40, and the camera 30 are sequentially stacked on the backlight side of the display panel 11, and the spacer 40 and the optical glue 20 are both accommodated in the grooves. In this embodiment, grooves are provided on the functional film layer on the backlight side of the display panel 11, and the optical glue 20 and spacers 40 are arranged in the grooves, which prevents the display device 10 from an increased thickness due to the arrangement of the optical glue 20 and the spacer 40. Moreover, the groove structure can reduce the number of film layers located above the camera 30, increase the light transmittance of the second display region of the display panel 11 and the amount of light incident on the lens 31 of the camera 30, and improve the shooting effect of the camera 30.

Refer to FIG. 1, in this embodiment, an opening on the backplate 12 is a first opening, an opening on the heat dissipation layer 13 is a second opening, and the groove includes the first opening formed at a position corresponding to the second display region on the back plate 12 and the second opening formed at a position corresponding to the second display region on the heat dissipation layer 13. A size of the first opening is equal to a size of the second opening, that is, a cross-sectional area of the first opening is equal to a cross-sectional area of the second opening. A cross-sectional shape of the groove corresponds to cross-sectional shapes of the camera 30 or the spacer 40, the cross-sectional area of the groove is bigger than or equal to an area of the optical glue 20, and the area of the optical glue 20 is bigger than or equal to an area of the spacer 40.

Preferably, as shown in FIG. 1, wherein an area the optical glue 20 is applied to is, for example, larger than the size of the spacer 40, since the size of the spacer 40 is larger than the size of the lens 31 and smaller than or equal to the size of the housing 32, the specific connection method is as follows: The optical glue 20 includes a first region located at the center and a second area located at the periphery of the first region. The first region is adapted to the size of the spacer 40, wherein the optical glue 20 in the first region is directly bonded to the spacer 40, and the optical glue 20 in the second region is directly bonded to the housing 32 and/or the positioning member 322 on the housing 32. Preferably, a projection of the second region on the surface of the housing 32 at least covers the positioning member 322 on the housing 32, and a height of the positioning member 322 protruding from the surface of the housing 32 opposite to the display panel 11 is equal to a thickness of the spacer 40, so as to ensure the positioning of the positioning member 322 and the effect of fixing the spacer 40 while making the display device as thin as possible. Further, the positioning member 322 is arranged around the spacer 40, and is enclosed with the housing 32 and the optical glue 20 to form a closed accommodating space, and a volume of the accommodating space is suitable for the spacer 40. Therefore, even when the spacer 40 and the first adhesive in the fixing groove 321 have a poor adhesion effect, the spacer 40 can still be fixed and sealed. In other embodiments of the present disclosure, since the volume of the accommodating space is adapted to the spacer 40, the fixing groove 321 and the first adhesive located in the fixing groove 321 can be omitted to save process steps to reduce the difficulty of the process, or, the housing 32 may not be provided with the fixing groove 321, and the first adhesive is provided in the gap region between the positioning member 322 and the spacer 40, which can also serve to achieve good fixing and sealing effect of the spacer 40.

In other embodiments of the present disclosure, an area of the optical glue 20 applied can also be equal to the size of the spacer 40. In this case, the size of the spacer 40 is the same as the size of the optical glue 20 and the size of the cross-sectional area of the groove, therefore the display device 10 achieves a good camera under panel effect while preventing gaps from generating between the backplate 12 and the heat dissipation layer 13, and between the optical glue 20 and the spacer 40 due to the arrangement of grooves, which affects a sealing effect of the display panel 11, and improves an effect against water and oxygen intrusion of the display panel.

In this embodiment, part of the region of the camera 30 is recessed in the groove, and part of the region of the camera protrudes outside the groove. Specifically, the housing 32 of the camera 30 is partially accommodated in the groove, and a cross-sectional area of an outer diameter of the housing is smaller than the cross-sectional area of the groove. However, in other embodiments of the present disclosure, since the region of the camera 30 protruding from the groove is not limited by the size of the groove, the cross-sectional area of the part of the housing 32 of the camera 30 protruding from the groove can also be larger than the cross-sectional area of the groove, so that the volume of the camera 30 can be set larger and the process difficulty is reduced.

In this embodiment, for example, a second adhesive 80 is further provided on a periphery of the housing 32. The second adhesive 80 is, for example, a UV adhesive. The UV adhesive is also called photosensitive adhesive or ultraviolet curing adhesive, which is a type of adhesive that can be cured only by ultraviolet light, and has the characteristics of fast curing speed and strong adhesion. The housing 32 is fixedly connected to the display panel 11 by the second adhesive 80 to ensure stable adhesion between the camera 30 and the display panel 11. The housing 32 is fixedly connected to the heat dissipation layer 13 of the display panel 11 by the second adhesive 80 to ensure stable adhesion between the camera 30 and the display panel 11 and improve the heat dissipation effect of the camera 30. Preferably, at least part of the second adhesive 80 is provided on a middle region between the heat dissipation layer 13 and the housing 32 in the groove, so as to shorten the heat conduction path between the housing 32 and the heat dissipation layer, and accelerate speed of heat dissipation of the housing 32.

In this embodiment, the camera further includes, for example, a filter arranged on a light incident side away from the lens 31, an image sensor, and a focus motor arranged between the lens 31 and the housing 32. The filter may be disposed adjacent to the lens 31, and the image sensor is disposed on the side of the filter away from the lens 31. The filter is, for example, an infrared filter (IR-CUT dual filter), when the infrared sensor outside the lens detects the intensity of the light, the built-in IR-CUT automatically switches the filter according to the external light. The intensity is automatically switched accordingly, so that the image can get the best imaging effect no matter during daytime or nighttime. The image sensor uses the photoelectric conversion function of the photoelectric device to convert the light image on the photosensitive surface into an electrical signal that is proportional to the light image. In this embodiment, the type of the image sensor may be a charge coupled device (CCD) sensor, a complementary metal oxide semiconductor (CMOS) sensor, and a contact image sensor (CIS). It should be noted that, in other embodiments of the present disclosure, the camera 30 may, for example, also be another type of camera including a lens, which is not limited in the present disclosure.

In this embodiment, the display device 10, for example, further includes a polarizer 50 and a cover plate 60 that are sequentially stacked on the display panel 11, and the polarizer 50 and the cover plate 60 are fixedly connected by an optical glue 21 provided between the polarizer 50 and the cover plate 60.

In this embodiment, the display panel 11 is an OLED display panel for illustration, but in other embodiments of the present disclosure, the type of the display panel may also be, for example, a mini-LED display panel, a micro-LED display panel, or a combination of the above types of the display panel.

Embodiment 2

Figure 5:
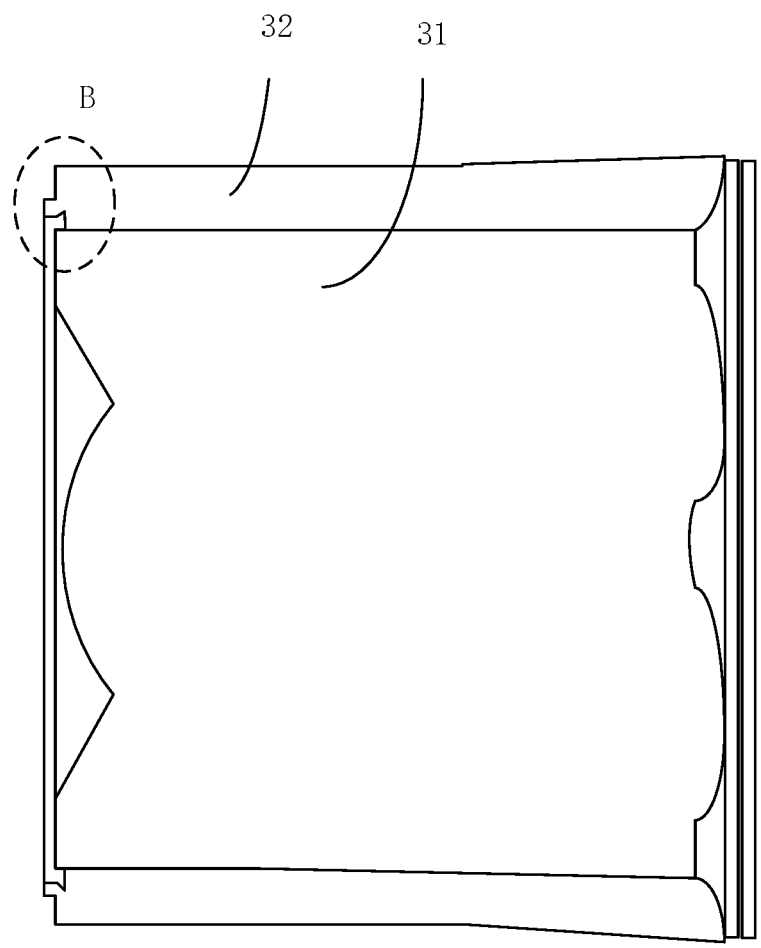
FIG. 5 is a schematic structural diagram of a camera module provided in Embodiment 2 of the present disclosure.
Figure 6:
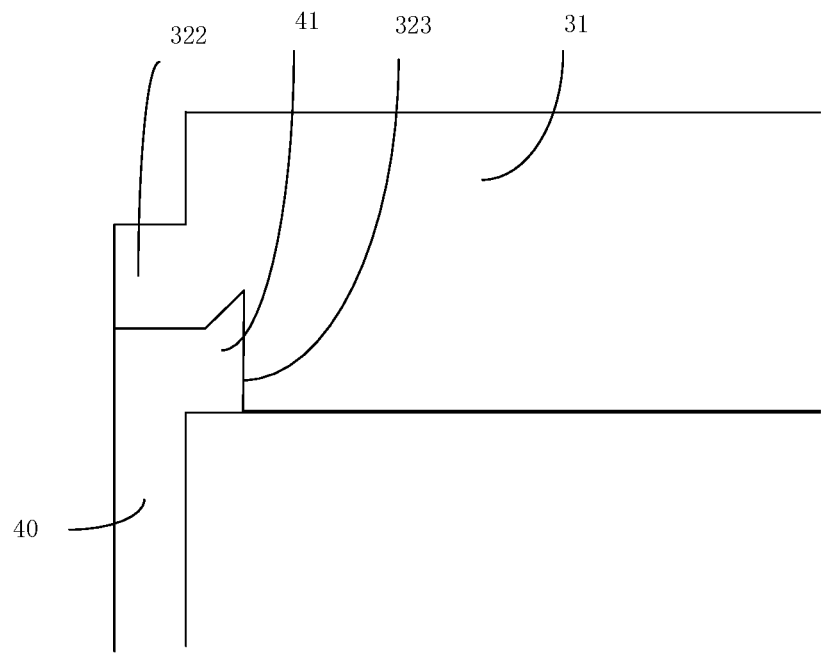
FIG. 6 is an enlarged schematic diagram of B in FIG. 5.

FIG. 5 is a schematic structural diagram of a camera provided in Embodiment 2 of the present disclosure. FIG. 6 is an enlarged schematic diagram of B in FIG. 5. As shown in FIG. 5 and FIG. 6, the Embodiment 2 of the present disclosure discloses a display device 10, including: a display panel 11, a camera 30 attached to a side of the display panel 11 by an optical glue 20, wherein the camera 30 comprises: a housing 32; a lens 31 fixed and accommodated in the housing 32; and a spacer 40 fixed on a side of the housing 32 facing the display panel 11 and completely covering a light incident surface of the lens 31, wherein a first surface of the spacer 40 is attached to the side of the display panel 11 by the optical glue 20, and the first surface of the spacer is a flat surface. In the display device 10 provided in the present disclosure, a spacer 40 covering the light incident area of the lens 31 of the camera 30 is provided between the optical glue 20 and the camera 30, which prevents the problem that the optical glue 20 on the display panel 11 directly covers the lens 31 during the process of attaching the display panel 11 to the camera 30, and causes the optical effect of the camera 30 to decline.

The structure of this embodiment is similar to that of the display device disclosed in the embodiment 1, and the same parts are not repeated in this embodiment.

The difference is that the spacer 40 is provided with at least one engaging member 41, for example, the engaging member 41 is arranged on a side edge of the spacer 40 away from the display panel 11, at least one engaging groove 323 is provided on the surface of the housing 32 on the side facing the display panel 11, and the engaging groove 323 is adapted to the size of the engaging member 41, and the number corresponds to one by one. The spacer 40 and the housing 32 are fixedly connected by the engaging member 41 and the engaging groove 323, so that the spacer 40 can be stably arranged above the lens 31. The snap-fit connection between the spacer 40 and the housing 32 provided in the embodiment of the present disclosure can achieve a good fixing effect while ensuring that the display device 10 is as thin as possible, and since no additional first adhesive is required, it has the advantage of simplifying the process steps. This embodiment does not limit the number of the engaging grooves 323, when a number of the engagement groove 323 is one, it is, for example, an annular fixing groove provided on the surface of the housing 32 on the side facing the display panel 11, and when the number of the engaging grooves 323 is multiple, they are, for example, a plurality of groove body structures arranged on the surface of the casing 32 facing the display panel 11 at intervals. This embodiment does not limit the location of the engaging groove 323. For example, it can be arranged on the surface of the housing 32 facing the display panel 11 and the adjacent position of the lens 31, or can also be arranged on the space between the surface of the housing 32 facing the display panel 11 and the lens 31, as long as the arrangement of the engaging groove 323 and the engaging member 41 which is configured to be accommodated in the engaging groove 323 does not affect the optical effect of the lens 31.

It should be noted that in other embodiments of the present disclosure, the plurality of engaging members 41 on the spacer 40 and the plurality of engaging grooves 323 on the housing 32 can also have other multiple embodiments. For example, the surface of the housing 32 facing the display panel 11 is further provided with a positioning member 322 protruding toward the display panel 11, and the side of the outer edge of the spacer 40 abuts against the positioning member of the housing 32 to the spacer 40 has the effect of positioning and fixing. At least one engaging member is protruded on the side of the outer edge of the spacer 40, and the positioning member 322 on the housing 32 is correspondingly provided with an engaging groove matching the number and size of the engaging member. The engaging member is fixedly connected to the engaging groove so that the spacer 40 can be stably disposed above the lens 31, which is not listed here in the present disclosure.

Embodiment 3

Figure 7:
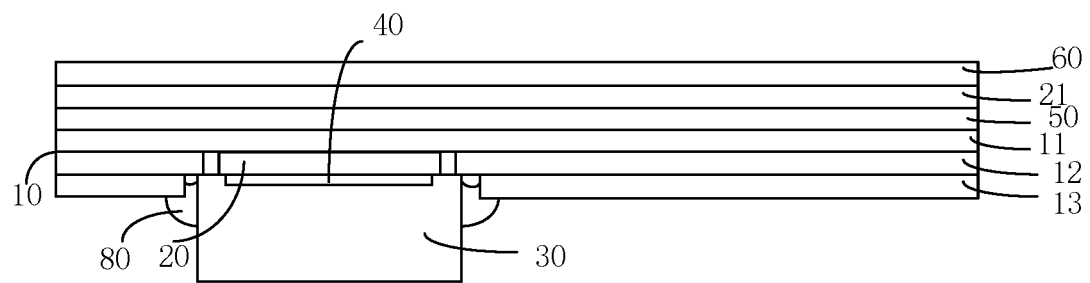
FIG. 7 is a schematic structural diagram of a display device provided in Embodiment 3 of the present disclosure.

FIG. 7 is a schematic structural diagram of a display device provided by the Embodiment 3 of the present disclosure. As shown in FIG. 7, the Embodiment 3 of the present disclosure discloses a display device 10, including: a display panel 11, a camera 30 attached to a side of the display panel 11 by an optical glue 20, wherein the camera 30 comprises: a housing 32; a lens 31 fixed and accommodated in the housing 32; and a spacer 40 fixed on a side of the housing 32 facing the display panel 11 and completely covering a light incident surface of the lens 31, wherein a first surface of the spacer 40 is attached to the side of the display panel 11 by the optical glue 20, and the first surface of the spacer is a flat surface. In the display device 10 provided in the present disclosure, a spacer 40 covering the light incident area of the lens 31 of the camera 30 is provided between the optical glue 20 and the camera 30, which prevents the problem that the optical glue 20 on the display panel 11 directly covers the lens 31 during the process of attaching the display panel 11 to the camera 30, and causes the optical effect of the camera 30 to decline.

The structure of this embodiment is similar to that of the display device 10 disclosed in the Embodiments 1 and 2, and the same parts are not repeated in this embodiment.

The difference is that in this embodiment, an opening on the backplate 12 is a first opening, an opening on the heat dissipation layer 13 is a second opening, and the groove includes the first opening formed at a position corresponding to the second display region on the backplate 12 and the second opening formed at a position corresponding to the second display region on the heat dissipation layer 13, wherein a size of the first opening is smaller than a size of the second opening, that is, the backplate 12 and the heat dissipation layer 13 are formed with a stepped structure at the position corresponding to the second display area of the display panel 11. A thickness of the optical glue 20 is equal to a thickness of the backplate 12, the housing 32 protrudes from the first opening of the backplate 12, part of the housing 32 is accommodated in the second opening of the groove, and at least part of the second adhesive 80 is disposed on a middle region between the heat dissipation layer 13 and the housing 32 in the groove. Due to the stepped structure formed by the backplate 12 and the heat dissipation layer 13, an outer size of the housing of the camera 30 can be set larger, which reduces the manufacturing cost of the camera 30. Moreover, since the part of the housing 32 is recessed in the second opening, the camera 30 can be closer to the heat dissipation layer 13, thereby shortening the heat conduction path and improving the heat conduction efficiency.

The above is a detailed introduction to the display panel provided by the embodiments of the present disclosure. Specific embodiments are used in the specification to illustrate the principles and implementations of the present disclosure. The description of the above embodiment is only used to help understand the method and core idea of the present disclosure. At the same time, for those skilled in the art, according to the idea of the present disclosure, there will be changes in the specific embodiment and scope of application. In summary, the content of this specification should not be construed as a limitation to the present disclosure.

What is claimed is:

1. A display device, comprising:
   a display panel;
   a camera attached to a side of the display panel by an optical glue, wherein the camera comprises:
      a housing; and
      a lens fixed and accommodated in the housing; and
   a spacer fixed on a side of the housing facing the display panel and completely covering a light incident surface of the lens, wherein a first surface of the spacer is attached to the side of the display panel by the optical glue, and the first surface of the spacer is a flat surface;
   wherein the display panel further comprises a first display region, a second display region, and a functional film layer disposed on a side of the display panel facing the camera, the functional film layer is provided with a groove at a position corresponding to the second display region, and the spacer is disposed in the groove.

2. The display device according to claim 1, wherein the side of the housing facing the display panel is provided with at least one fixing groove, a first adhesive is provided in the at least one fixing groove, and the spacer is fixedly connected to the housing by the first adhesive.

3. The display device according to claim 1, wherein the spacer is provided with a plurality of engaging members, the housing is correspondingly provided with a plurality of engaging grooves adapted to the plurality of engaging members, and the spacer and the housing are fixedly connected to each other by the plurality of engaging members and the plurality of engaging grooves.

4. The display device according to claim 1, wherein a positioning member is provided on a surface of the housing facing the display panel.

5. The display device according to claim 4, wherein a height of the positioning member protruding from the surface of the housing facing the display panel is equal to a thickness of the spacer.

6. The display device according to claim 4, wherein the positioning member is arranged around the spacer.

7. The display device according to claim 4, wherein an area the optical glue is applied to is equal to an area of the spacer.

8. The display device according to claim 6, wherein the optical glue is defined with a first region located at a center position and a second region located at a periphery of the first region, and an area of the first region is equal to an area of the spacer.

9. The display device according to claim 8, wherein the optical glue in the first region is directly bonded to the spacer, and the optical glue in the second region is directly bonded to the positioning member.

10. The display device according to claim 6, wherein the positioning member abuts against a side of an outer edge of the spacer.

11. The display device according to claim 6, wherein a gap between the positioning member and the spacer is provided with a first adhesive.

12. The display device according to claim 1, wherein the spacer further comprises a second surface disposed opposite to the first surface, and the second surface is parallel to the first surface.

13. The display device according to claim 1, wherein the spacer is parallel to the display panel.

14. The display device according to claim 1, wherein the spacer and the lens are spaced apart.

15. The display device of claim 1, wherein the functional film layer comprises a backplate and a heat dissipation layer, the backplate is disposed between the display panel and the heat dissipation layer, the groove comprises a first opening formed at a position corresponding to the second display region on the backplate and a second opening formed at a position corresponding to the second display region on the heat dissipation layer, and an area of the first opening is smaller than or equal to an area of the second opening.

16. The display device according to claim 15, wherein a part of the housing is accommodated in the second opening.

17. The display device according to claim 15, wherein a second adhesive is provided on a periphery of the housing, and the housing is fixedly connected to the heat dissipation layer by the second adhesive.

18. The display device according to claim 1, wherein the second display region is a light-transmitting display region possessing a display function and a light-transmitting function.

19. A display device, comprising:
a display panel;
a camera attached to a side of the display panel by an optical glue, wherein the camera comprises:
  a housing; and
  a lens fixed and accommodated in the housing; and
a spacer fixed on a side of the housing facing the display panel and completely covering a light incident surface of the lens, wherein a first surface of the spacer is attached to the side of the display panel by the optical glue, and the first surface of the spacer is a flat surface;
wherein the side of the housing facing the display panel is provided with at least one fixing groove, a first adhesive is provided in the at least one fixing groove, and the spacer is fixedly connected to the housing by the first adhesive.

20. A display device, comprising:
a display panel;
a camera attached to a side of the display panel by an optical glue, wherein the camera comprises:
  a housing; and
  a lens fixed and accommodated in the housing; and
a spacer fixed on a side of the housing facing the display panel and completely covering a light incident surface of the lens, wherein a first surface of the spacer is attached to the side of the display panel by the optical glue, and the first surface of the spacer is a flat surface;
wherein a positioning member is provided on a surface of the housing facing the display panel;
wherein the positioning member is arranged around the spacer.

* * * * *